(12) United States Patent
Timinger

(10) Patent No.: US 8,058,873 B2
(45) Date of Patent: Nov. 15, 2011

(54) PREVENTION QUENCH IN A MAGNETIC RESONANCE EXAMINATION SYSTEM

(75) Inventor: Holger Timinger, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 260 days.

(21) Appl. No.: 12/513,183

(22) PCT Filed: Nov. 5, 2007

(86) PCT No.: PCT/IB2007/054473
§ 371 (c)(1),
(2), (4) Date: May 1, 2009

(87) PCT Pub. No.: WO2008/056313
PCT Pub. Date: May 15, 2008

(65) Prior Publication Data
US 2010/0069738 A1   Mar. 18, 2010

(30) Foreign Application Priority Data
Nov. 10, 2006   (EP) ..................... 06123801

(51) Int. Cl.
*G01V 3/00*   (2006.01)
(52) U.S. Cl. ........................ 324/318; 324/319
(58) Field of Classification Search .................. 324/318, 324/319, 315
See application file for complete search history.

(56) References Cited

U.S. PATENT DOCUMENTS

| 6,516,282 | B2 * | 2/2003 | Hedlund et al. ............... 702/132 |
| 2002/0156595 | A1 | 10/2002 | Hedlund et al. |
| 2004/0017195 | A1 | 1/2004 | Kassai et al. |
| 2004/0064031 | A1 | 4/2004 | Dean et al. |
| 2005/0148845 | A1 | 7/2005 | Dean et al. |
| 2009/0140735 | A1 * | 6/2009 | Chen et al. ..................... 324/307 |
| 2010/0013584 | A1 * | 1/2010 | Huang et al. ................... 335/300 |

FOREIGN PATENT DOCUMENTS
WO   2005124381 A2   12/2005
* cited by examiner

*Primary Examiner* — Louis Arana

(57) ABSTRACT

A magnetic resonance examination system (10) includes a superconducting main magnet (20) surrounding an examination region (18) and generating a main magnetic field in the examination region (18) A magnetic field gradient system (30) selectively causes alternating gradient magnetic fields in the examination region (18). The magnetic field gradient system (30) is disposed outside of the main magnet (20). In order to provide stable operation of the superconducting main magnet (20) of a magnetic resonance examination system (10) with such a magnetic field gradient system (30), the magnetic resonance examination system (10) is provided with a predicting device (91) and a preventing device (92) The predicting device (91) predicts the behavior of the main magnet (20) due to the gradient magnetic fields (e.g., by calculating the expected heat load of the main magnet caused by an imaging protocol) and the preventing device (92) prevents, based on the predicted behavior of the main magnet (20), the main magnet (20) from quenching.

17 Claims, 4 Drawing Sheets

PREVENTION QUENCH IN A MAGNETIC RESONANCE EXAMINATION SYSTEM

FIELD OF THE INVENTION

The present invention relates to a magnetic resonance examination system and to a method of operating such a magnetic resonance examination system. In particular the present invention relates to a magnetic resonance examination system comprising a superconducting main magnet surrounding an examination region and generating a main magnetic field in the examination region, and further comprising a magnetic field gradient system selectively causing alternating gradient magnetic fields in the examination region, said magnetic field gradient system being disposed outside of the main magnet.

BACKGROUND OF THE INVENTION

Recently, new magnetic resonance examination system designs have been proposed, in which the main magnet system comprises magnet coils of superconductive material, and in which the magnetic field gradient system is located at the outside of the superconducting coil system and a weak-iron flux conduction system is provided to guide the magnetic gradient flux into the patient bore. A detailed description of such a magnetic resonance examination system is given in U.S. Pat. No. 7,417,434. A main advantage of such new magnetic resonance examination systems is a reduced scanner acoustic noise ("silent imaging"). Furthermore, the superconductive coils of the main magnet are closer to the examination region without compromising the effective bore size. Accordingly, less superconductive material is needed, which reduces the overall costs of the magnetic resonance examination system.

However, the arrangement of the magnetic field gradient system outside of the main magnet of the magnetic resonance examination system influences the main magnet's operation. The weak-iron flux conduction system has a relatively high energy dissipation into the superconducting main magnet coils due to magnetic hysteresis in the flux conduction system. In particular, the timely and spatially changing gradient magnetic fields caused by the magnetic field gradient system leads to dynamic AC losses within the windings of the main magnet coils. The main sources of such AC losses are magnetization losses, eddy current losses, self-field losses, dynamic resistance losses, transport current losses, the resistive loss and the loss due to the flux motion. Such AC losses may lead to a dynamic heat load, which may locally increase the main magnet's temperature. This can initiate a rapid loss of field strength ("quench") in the superconducting magnet. If the magnet is made of high Tc superconductive material, heat conduction is very slow, which complicates an efficient temperature control of the main magnet considerably.

From conventional magnetic resonance examination systems, in which the magnetic field gradient system is provided inside the main magnet, a large number of heat management solutions are known. The aim of these approaches is to limit the temperature in the examination space, where the patient is situated, i.e. inside the magnet bore. For this purpose temperature sensors are positioned in the magnet bore and gradient coil heating is controlled depending on the sensor data. An example of such a conventional magnetic resonance examination system is given in U.S. Pat. No. 7,209,778. However, since such systems are not exposed to dynamic heat loads, the known solutions are not suitable to ensure stable operation of the superconducting main magnet of a magnetic resonance examination system with a magnetic field gradient system being disposed outside of the main magnet.

SUMMARY OF THE INVENTION

It is an object of the present invention to provide a technique to ensure stable operation of the superconducting main magnet of a magnetic resonance examination system with a magnetic field gradient system being disposed outside of the main magnet.

The object of the present invention is achieved by a magnetic resonance examination system, comprising a predicting device, adapted to predict the behavior of the main magnet due to the gradient magnetic fields, and further comprising a preventing device, adapted to prevent, based on the predicted behavior of the main magnet, the main magnet from quenching, and thus ensure stable operation of the main magnet.

This object is also achieved according to the invention by a method of operating such a magnetic resonance examination system, which comprises the steps of predicting the behavior of the main magnet due to the gradient magnetic fields, and, based on the predicted behavior of the main magnet, preventing the main magnet from quenching, and thus ensure stable operation of the main magnet.

The object of the present invention is also achieved by a computer program to be executed in a computer, said program comprising computer instructions to predict the behavior of the main magnet of a magnetic resonance examination system due to gradient magnetic fields caused by a magnetic field gradient system being disposed outside of the main magnet, when the computer program is executed in the computer.

Technical effects can thus be realized on the basis of the instructions of the computer program in accordance with the invention. Such a computer program can be stored on a hard disk, on a carrier such as a CD-ROM or it can be available over the Internet or another computer network. Prior to executing the computer program is loaded into the computer by reading the computer program from the carrier, for example by means of a CD-ROM player, or from the internet, and storing it in the memory of the computer. The computer includes inter alia a central processor unit (CPU), a bus system, memory means, e.g. RAM or ROM etc., storage means, e.g. floppy disk or hard disk units etc. and input/output units. Alternatively, the inventive computer program could be implemented in hardware, e.g. using one or more integrated circuits.

In accordance with one aspect, a magnetic resonance examination system is provided with a quench protection functionality, which is implemented by predicting the main magnet's behaviour. In other words, one or more future properties of the main magnet are forecast. Since the main magnet's characteristic is predetermined, steps to prevent a quenching of the main magnet can be taken well in advance before the start of a quenching process. Thus, with the present invention a main magnet protection is achieved and a stable operation of the superconducting main magnet can be ensured in case of the magnetic field gradient system being disposed outside of the main magnet. As a result, a very safe and reliable magnetic resonance examination procedure can be provided. The risk of a system downtime of several hours or even days because of an uncontrolled quench is significantly reduced. In general, the present application can be applied to all magnetic resonance examination systems, in which the gradient coil system can cause losses in the main magnet.

These and other aspects of the invention will be further elaborated on the basis of the following embodiments which are defined in the dependent claims.

In one implementation of a heat management model, a corresponding feedforward control of the main magnet's temperature is provided. The prediction device and the preventing device are adapted accordingly. As a result, this allows superconducting material which has slow heat conduction, such as high Tc superconductor material, to be applied without the need of excessive cooling capacity.

According to an embodiment of the invention the predicting device is adapted to calculate (timely and spatially resolved) the expected AC losses in the main magnet due to the gradient magnetic field. The predicting device is further adapted to subsequently apply the thermal conductivity equation to determine the temperature distribution in the main magnet and/or the heat load of the main magnet. Furthermore the predicting device is adapted to decide, whether the predicted temperature distribution will result in a quench of the main magnet. The temperature distribution is an important feature in order to make a prediction about the main magnet's tendency to quench. However, other properties, like voltage measurements of the whole or parts of the main magnet, can be addressed as well. The prediction is carried out by the prediction device using one or more appropriate mathematical models of the main magnet and the gradient system, which include information about geometry and material properties of those elements. In particular, the magnetic field of the gradient coils is determined in a first step. The orientation of this field is given by the arrangement of the gradient coils and has only to be calculated once for each of the available gradient directions. The field strength and frequency is further specified by the selected imaging protocol. From the magnetic field of the gradient coils and the magnetic field of the main magnet, the total field which acts on the main magnet is derived. The resulting losses in the main magnet in terms of dissipated energy are determined mathematically. Such mathematical models preferably take into account dedicated material properties, like the critical current of the superconducting material of the main magnet, which depends on the temperature and applied magnetic field and thus differs for different locations in the magnet. Besides the magnetic field and the critical current, the transport current in the magnet and the geometric shape of the superconducting material affect the dissipated amount of energy to be predicted, and therefore are preferably included into the mathematical model as well. The actually implemented formulae for calculation can reach from simple approximations to precise solutions of Maxwell's Equations.

According to another embodiment, the predicting device is adapted to predict the behavior of the main magnet prior to image acquisition. In this case the predicting device is preferably adapted to decide, whether or not an image acquisition procedure would negatively affect the main magnet's operation. This decision is preferably made depending on the available cooling means for cooling the superconducting main magnet.

It has been found, that (besides on static magnetic field and geometry of the main magnet and the gradient system) the influence of the alternating gradient magnetic fields on the main magnet strongly depends on the duration, frequency, and intensity of the gradient fields. These parameters are reflected in the implemented magnetic resonance imaging protocols (i.e. the planned and/or executed image acquisition sequences). Therefore the predicting device is preferably adapted to predict the behavior of the main magnet by using an imaging protocol, which is intended for use and/or which is actually used. For example a fast changing gradient field or a long-lasting continuous gradient field will result in a high AC loss in the main magnet, compared to a slow gradient switching or short periods of gradient fields.

According to another embodiment, the predicting device is adapted to continuously update the prediction during image acquisition. In other words, the prediction is not only generated at a time prior to image acquisition, but will further be verified and updated during image acquisition. By this way, the magnet's real operation as well as dynamic effects influencing the main magnet's operation can be taken into account, leading to a very realistic prediction of the future magnet behavior. In this case the predicting device is preferably adapted to monitor the status of the main magnet. More particularly, the magnetic resonance examination system preferably comprises a number of sensors to acquire properties of the main magnet, and the predicting device is adapted to use the acquired sensor data to verify and/or update the prediction during image acquisition. In other words, the feedforward control of the main magnet's temperature is further refined by measurement of a number of temperature sensors in, at or nearby the main magnet. Additional information about the status of the main magnet is preferably obtained from voltage measurements of the whole main magnet or parts of the main magnet, for which purpose a number of appropriate sensors are employed. If only one temperature sensor is used, the sensor is preferably located at a position, which is most important in terms of temperature behavior, e.g. at the position where the highest dissipation due to gradient magnetic fields occurs. In another embodiment of the invention the main magnet is divided into a number of subsections, to each of which a temperature sensor is assigned.

For example, the actual main magnet's temperature at the beginning of the image acquisition process is determined by means of a temperature sensor within the main magnet, and the predicted temperature distribution, which has been calculated using model data, is adjusted using this real temperature data. Additional temperature updates during the running image acquisition process may guarantee very precise status statements. Furthermore, by using real temperature data, differences between the predicted heat load and/or temperature distribution and the actual heat load and/or temperature distribution can be determined easily. Hence, the predicting device is preferably further adapted to detect defects of the main magnet's cooling system.

For the purpose of the present invention data and/or results of the predicting device are transferred to and used by the preventing device, which is adapted to avoid overheating of the main magnet due to AC losses and as a result to prevent a quench. This can be done in different ways.

According to another embodiment, the preventing device is adapted to reject an imaging protocol prior to image acquisition. In other words, the execution of image acquisition procedures, which would negatively affect the main magnet's operation, can be rejected in advance. For example, an imaging protocol can be rejected by the preventing device if the expected heat load exceeds the cooling capacity of the system. If an image acquisition procedure, which would negatively affect the main magnet's operation, is already executed in the magnetic resonance examination system, said acquisition procedures can be stopped by the preventing device.

According to another embodiment, such image acquisition procedures can be allowed by the preventing device, if they are modified in a way that they will not negatively affect the main magnet's operation. Such modification can be done in advance, i.e. prior to image acquisition, or even during the running image acquisition process. The modifying step is carried out preferably by the appropriate system component or even by the preventing device itself. A very simple modification would be to suspend the start of the image acquisition for a certain time, e.g. some minutes. This could be the case, for example, if the predicting device comes to the conclusion that the starting temperature of the main magnet is too high due to a preceding image acquisition process.

According to a another embodiment, sufficient cooling can be provided and allocated depending on the predicted behavior of the main magnet. Again, this can be done prior to image acquisition or during image acquisition. Especially, if the main magnet is made of superconducting material with very slow thermal conduction, which is the case for high Tc superconducting material, additional cooling must be provided long before it is actually needed at a certain location in the main magnet. This can be achieved by the present invention.

All preventing measures are carried out in a way that specific safety margins of the magnet temperature are maintained during operation of the magnetic resonance examination system. For this purpose a number of temperature thresholds are defined preferably beforehand during setup of the magnetic resonance examination system. However, the thresholds can also be determined dynamically by the preventing device based on the known setup of the magnetic resonance examination system.

In a very simple embodiment the preventing device is adapted in a way that a general temperature threshold is not exceeded within the whole main magnet. In an advanced embodiment the preventing device is adapted in a way that the predicted and/or measured temperature values for certain parts of the main magnet are compared with a predefined temperature threshold distribution of the main magnet, which is provided to the predicting device from e.g. a database or data storage. By this way a decision about the acceptance of the imaging protocol and/or the steps to be taken in order to guarantee a proper operation of the main magnet can be made on a very detailed basis. For example, to elements of the main magnet, which are not very effectively cooled because they are positioned away from the position of the cooling elements, a lower temperature threshold is assigned, than to elements of the main magnet, which are positioned near such cooling elements, and thus are cooled in a much more effective way.

According to another embodiment, AC losses and/or heat load and temperature distributions are calculated in beforehand for all standard imaging protocols of a given magnetic resonance examination system and subsequently transferred to and stored together with relevant information (e.g. system setup and image acquisition protocol information as well as predicted AC losses, temperature distributions, etc. for a given imaging protocol) in a data storage. In a very simple embodiment, look-up tables are used for data storage. Such data can be used by the predicting device and/or the preventing device in future cases. In other words, based on the stored information the predicting device then can predict the behavior of the main magnet without complex calculation, merely on the basis of previously stored data. For example, the predicting device approximates the AC loss related to an unknown imaging protocol by interpolation. For example, if a known imaging protocol is executed with double length, the predicted AC loss will be doubled as well. In yet another embodiment, in addition to the data mentioned above, operation instructions of the predicting and/or the preventing device are transferred to the data storage and stored, which may be used e.g. for evaluating purposes or for development of enhanced predicting models.

It should be pointed out, that certain parts of the inventive method can be carried out both by means of the predicting device and by means of the preventing device. Both devices as a whole are adapted to carry out the method.

BRIEF DESCRIPTION OF THE DRAWINGS

These and other aspects of the invention will be described in detail hereinafter, by way of examples, with reference to the following embodiments and the accompanying drawings; in which.

DETAILED DESCRIPTION OF THE EMBODIMENTS

Figure 1:
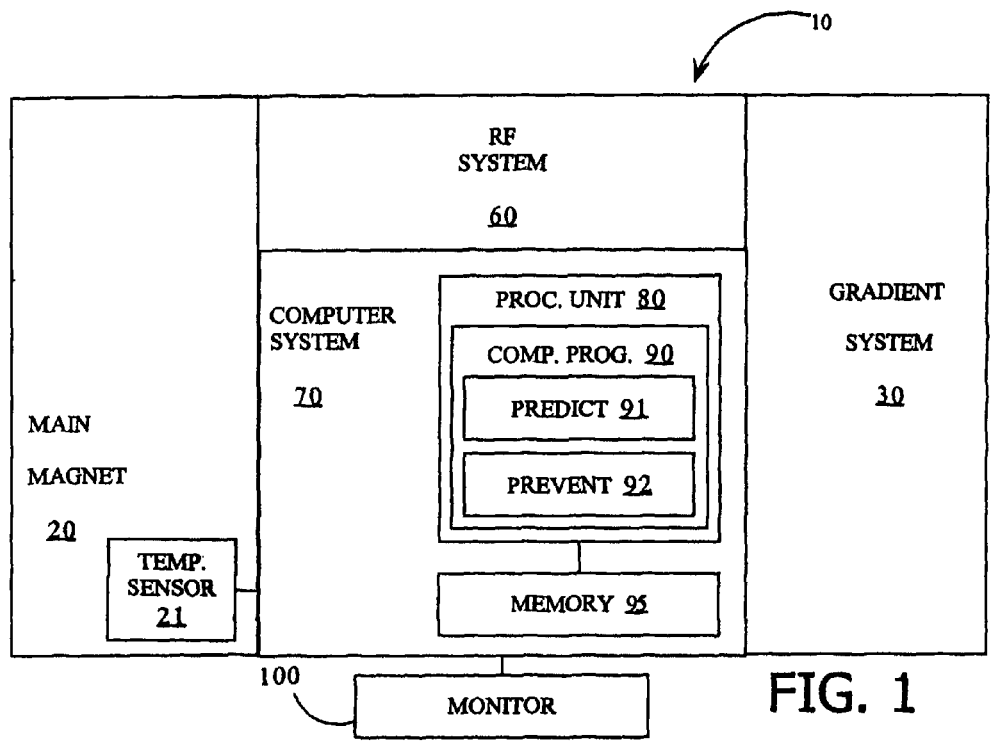
FIG. 1 shows a schematic block diagram of a magnetic resonance imaging system.

As illustrated in FIG. 1, the magnetic resonance imaging (MRI) scanner 10 comprises a superconducting main magnet 20, which surrounds an examination region 18 (see FIG. 2) and generates a main magnetic field in the examination region 18. Furthermore the MRI scanner 10 comprises a magnetic field gradient system 30 that enables spatial localization of the MRI signals. The magnetic field gradient system 30 selectively causes alternating gradient magnetic fields in the examination region 18, and is disposed outside of the main magnet 20, as described below in more detail. Furthermore the MRI scanner 10 comprises a radio frequency (RF) system 60 that transmits energy and receives signal information, and a computer system 70 to control the scanner's components and subsystems.

Figure 2:
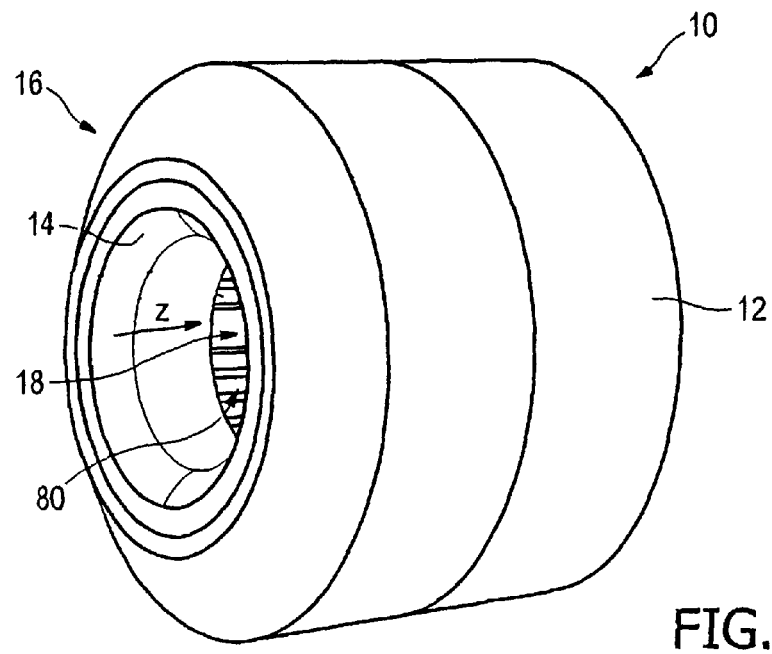
FIG. 2 shows a perspective view of a magnetic resonance imaging system.
Figure 3:
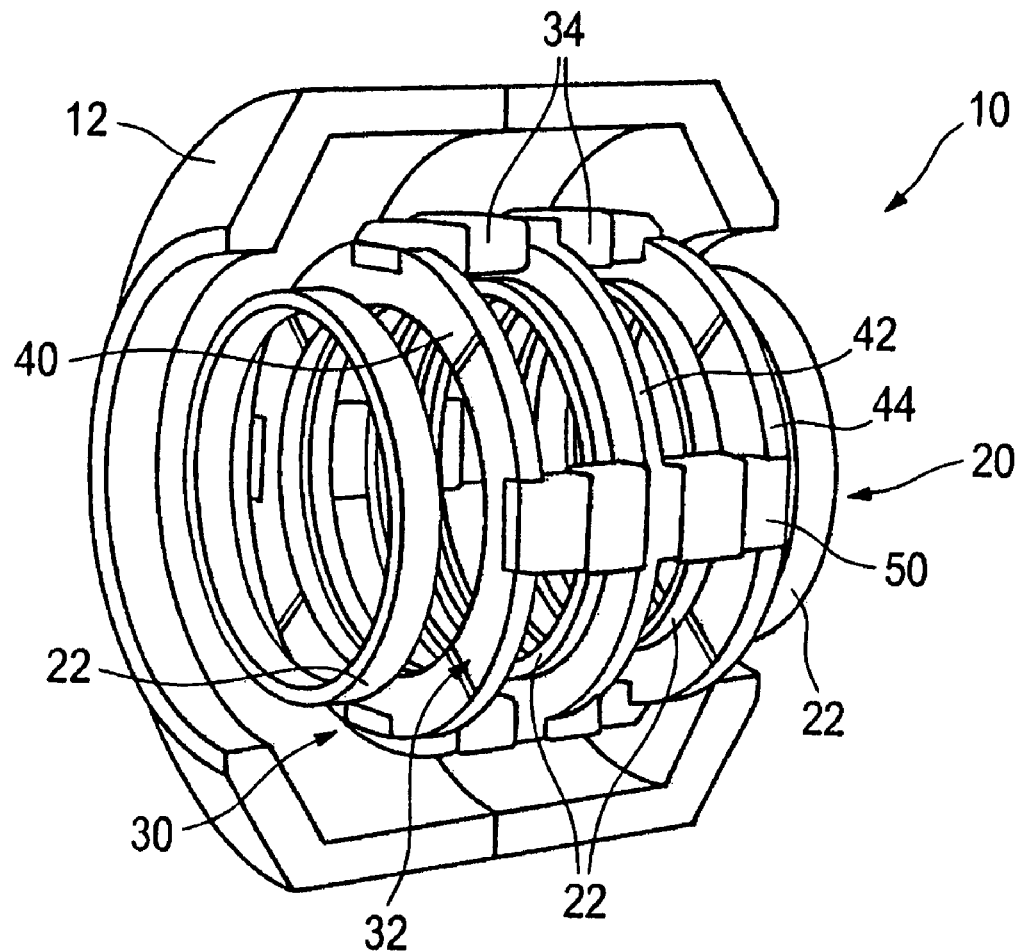
FIG. 3 shows a perspective view of a magnetic resonance imaging system of FIG. 2, in which a portion of the vacuum jacket and the support tube of the main field magnet have been removed to reveal the main magnet coils and the magnetic field gradient system.

With reference to FIGS. 2 and 3, the MRI scanner 10 includes a housing made up of an outer flux return shield 12 and an inner bore tube 14. The outer flux return shield 12 and the inner bore tube 14 are sealed together to define a vacuum jacket 16. An examination region 18 lies inside of the bore tube 14. The patient or other imaging subject is positioned in the examination region 18. A main magnet 20 is disposed inside of the vacuum jacket 16. The magnet 20 is made using superconducting material, e.g. a high Tc superconductor operating at 30 to 100 K. The main magnet 20 includes a plurality of spaced apart generally annular magnet windings segments 22, six segments in the embodiment of FIG. 3. Each windings segment 22 includes a number of turns of an electrical conductor, preferably a superconductor. Typically, the main magnet 20 is closer to the bore tube 14 than to the flux return shield 12.

The windings segments 22 of the main magnet 20 are designed to produce a substantially spatially uniform magnetic field in the examination region 18 in which the main magnetic field vector is directed along an axial or z-direction parallel to the axis of the bore tube 14. The outer flux return shield 12 is made of a ferromagnetic material and provides a flux return path for completing the magnetic flux loop. That is, magnetic flux generated by the main magnet 20 follows a closed loop that passes through the inside of the bore tube 14 including the examination region 18 and closes back on itself by passing through the flux return shield 12. As a result, there exists a low magnetic field region within the vacuum jacket 16 between the magnet 20 and the flux return shield 12.

A magnetic field gradient system 30 is disposed in the low magnetic field region existing outside the main magnet 20 and inside the flux return shield 12. The magnetic field gradient system 30 includes a ferromagnetic yoke 32 and a plurality of magnetic field gradient coils 34. In the embodiment illustrated in FIGS. 2 and 3, the ferromagnetic yoke 32 includes three ferromagnetic rings 40, 42, 44 disposed between the generally annular magnet windings segments 22. The magnetic field gradient coils 34 include wire turns or other electrical conductors wrapped around ferromagnetic crossbars 50 which are arranged generally transverse to the ferromagnetic rings 40, 42, 44 and which are connected with the ferromagnetic rings 40, 42, 44. The magnetic field gradient system 30 has a four-fold rotational symmetry provided by arrangement of four crossbars 50 at 90 annular intervals. Each crossbar 50 includes magnetic field gradient coils 34 wrapped on either side of the plane of bilateral symmetry.

More detailed information about the MRI scanner 10 is given in U.S. Pat. No. 7,417,434, which as a whole is hereby incorporated by reference.

The computer system 70 of the MRI scanner 10 comprises a processing unit 80, which is adapted according to the invention for performing all tasks of calculating and computing data as well as determining and assessing results. This is achieved with a computer program 90 comprising computer instructions adapted for carrying out the steps of the method, e.g., the method of FIG. 4, when the software is executed in the processing unit 80. In particular, the processing unit 80 is adapted to execute a computer program 90 for preventing the main magnet 20 of the MRI scanner 10 from quenching. By execution of the computer program 90 a predicting software module 91 and a preventing software module 92 are implemented, the functionality of both modules is discussed in more detail below. All devices, in particular the processing unit 80, and the implemented software modules 91, 92, are constructed and programmed in a way that the procedures for data processing run in accordance with the method of the invention. The processing unit 80 itself may comprise functional modules or units, which are implemented in form of hardware, software or in form of a combination of both. In other words, the present invention could also be implemented merely using dedicated hardware, without using a computer program. In this case the predicting software module 91 and the preventing software module 92 would be implemented as hardware devices showing identical functionality.

The computer system 70 of the MRI scanner 10 is connected to an external touch screen monitor 100, which serves as interface to the MRI scanner's operator. Alternatively a conventional monitor screen is used in combination with a computer keyboard and/or computer mouse.

Figure 4:
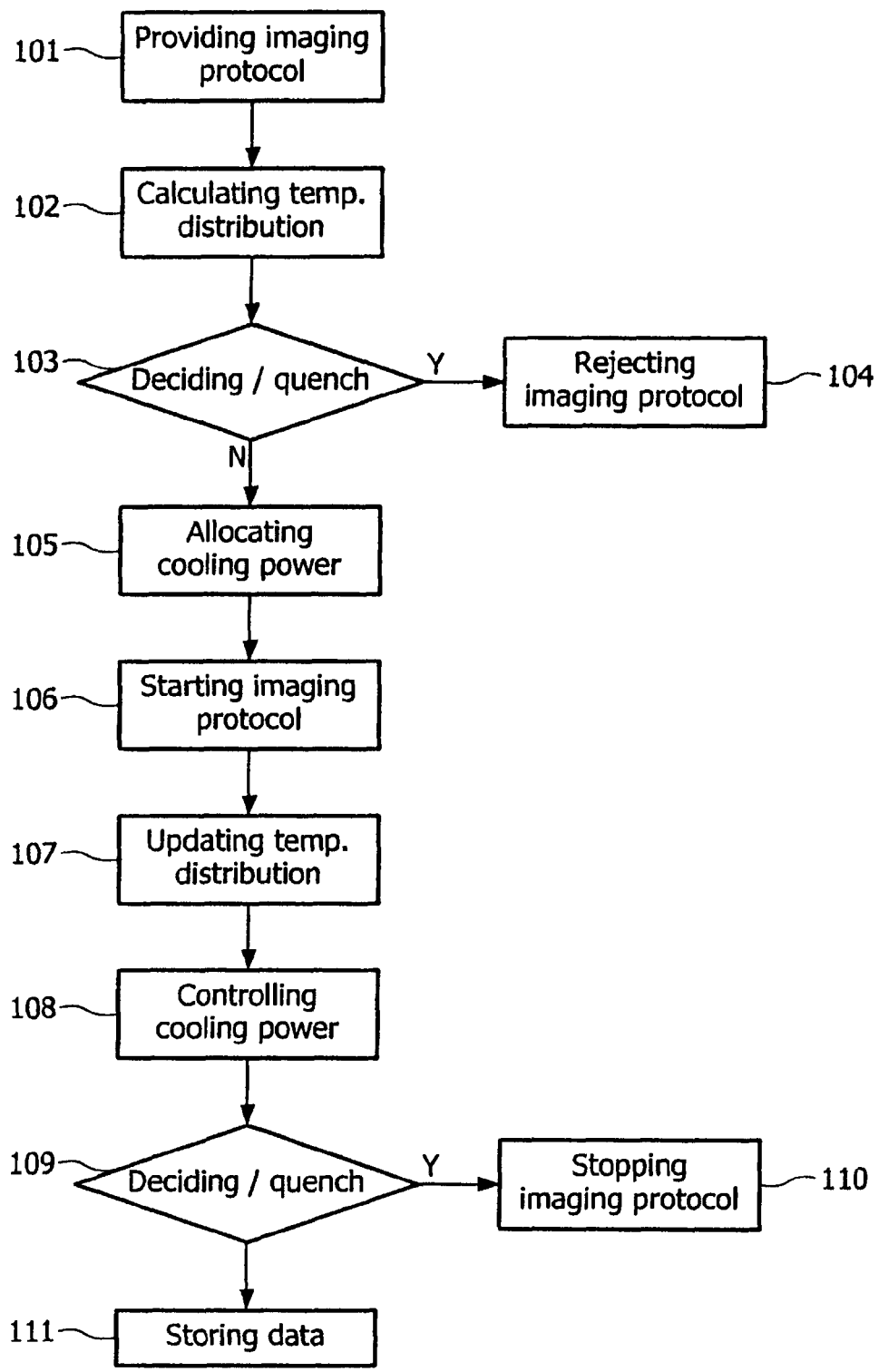
FIG. 4 shows a flow chart of the method according to the invention.
Figure 5:
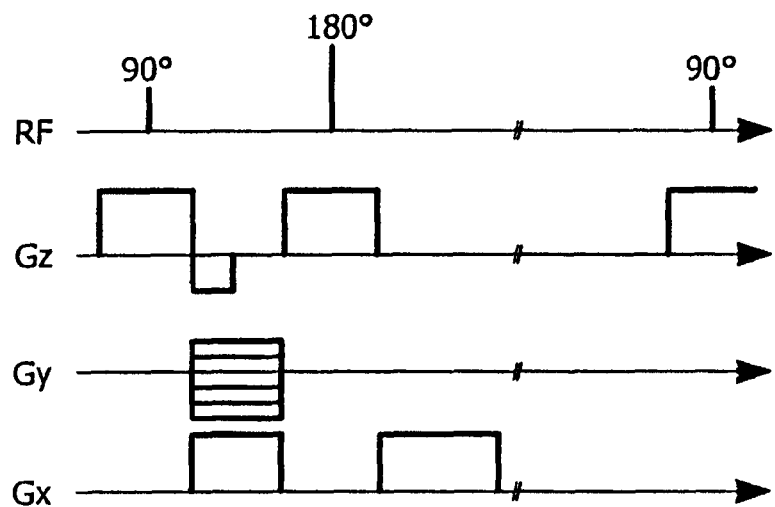
FIG. 5 shows an example of an imaging protocol.

With reference to FIG. 4, the method of operating such a MRI scanner 10 is described. In a first step 101 the detailed specification of the imaging protocol is provided by the operator of the MRI scanner 10. An exemplary section of an imaging protocol is given in FIG. 5. The figure shows the time-dependent RF pulse, which is used to rotate the spin of the excited nuclei of an object in the examination region around a certain angle. The gradients Gx, Gy, and Gz are switched in a way to gain spatially resolved images of the object in the examination region. It will be evident, that the given imaging protocol serves merely as an example, and that the present invention is not limited to this specific imaging sequence.

In a subsequent step 102 the expected AC losses $q_{ext}$ and the resulting temperature distribution in the main magnet 20 are calculated by means of the predicting software module 91 using an appropriate model. The AC losses can either be calculated using reasonable approximations, or by solving Maxwell's Equations. In the following an example is given how the resulting temperature distribution in the main magnet can be determined from the predicted AC losses $q_{ext}$. Such a calculation can be accomplished using the known temporal and spatial differential equation of the temperature distribution T. In the equation $$c(T)\rho \frac{\partial T}{\partial t} = \nabla(\lambda(T)\nabla T) + q_j + q_{ext}$$

c, ρ and λ are the specific heat, mass density, and thermal conductivity of the superconducting material of the main magnet 20. The mass density ρ is assumed constant, while specific heat c and thermal conductivity λ are strongly temperature dependent. Additionally, thermal conductivity is an anisotropic material property. The nabla operator abbreviates $$\nabla = \left(\frac{\partial}{\partial x}, \frac{\partial}{\partial y}, \frac{\partial}{\partial z}\right)^T.$$

The variable $q_j$ refers to the joule heating density caused by resistive conduction. Finally, $q_{ext}$ represents externally applied heat densities, introduced by time-varying gradient magnetic fields from gradient coils located outside the main magnet 20.

Figure 6:
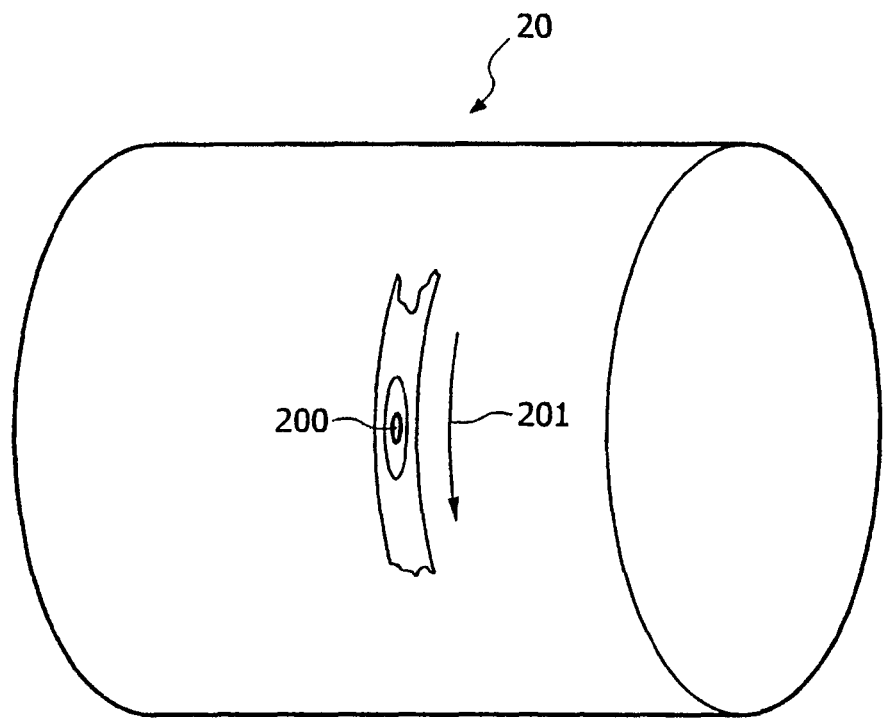
FIG. 6 shows a temperature distribution at the surface of a main magnet illustrating a hot-spot.

FIG. 6 shows a predicted local temperature distribution at the surface of a main magnet 20 after a possible image acquisition process. A so called hot-spot 200 is illustrated. The hot-sport 200 corresponds to a locally confined resistive conducting area. The heat spread preferably extends in the direction 201 of the conductor path. This hot-spot would in consequence of a specific gradient field distribution lead to a quench of the main magnet 20, if the imaging protocol would be executed without changes of the main magnet's cooling approach.

In a subsequent step 103, the predicting software module 91 then decides prior to image acquisition, whether the cooling capacity of the MRI scanner 10 is adequate or the predicted temperature distribution would result in a quench of the main magnet 20. During this step, the predicting software module 91 compares the predicted temperature values with a predetermined temperature threshold. If the execution of the imaging protocol would lead to a quench of the main magnet 20, the imaging protocol is rejected by means of the preventing software module 92 in step 104. Otherwise, sufficient cooling power is allocated by means of the preventing software module 92 in step 105 and imaging is started in step 106. In an alternative embodiment (not shown) instead of the rejecting step 104 the imaging protocol is adapted in an adapting step by means of the predicting software module 91 in a way that it would be allowed.

During image acquisition, the heat and temperature prediction is continuously updated in the predicting software module 91 by adjusting the model and combining it with temperature measurements, which are obtained from sensors 21 in the main magnet 20 (step 107). The fusion of sensor data and model data is preferably accomplished by means of the predicting software module 91 using a state prediction filter like a Kalman Filter.

During image acquisition, the preventing software module 92 continuously controls (step 108) the cooling elements (not shown) of the MRI scanner 10 in a way that a quench of the main magnet 20 is safely prevented, well before a critical temperature value is reached, which is determined in step 109. If this is not possible, e.g. because the maximum cooling capacity is reached, the preventing software module 92 stops the imaging procedure (step 110).

Results of the predicting software module 91 are transferred to and stored in an internal look-up table database 95 implemented in the computer system 70 of the MRI scanner 10 (step 111), from which they can be read-out in a subsequent imaging procedure. Additionally data can be stored after step 103 and/or 104.

It will be evident to those skilled in the art that the invention is not limited to the details of the foregoing illustrative embodiments, and that the present invention may be embodied in other specific forms without departing from the spirit or essential attributes thereof The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" do not exclude a plurality, and that a single element, such as a computer system or another unit may fulfil the functions of several means recited in the claims. Any reference signs in the claims shall not be construed as limiting the claim concerned.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance examination system, comprising
   a superconducting main magnet surrounding an examination region and generating a main magnetic field in the examination region, and
   a magnetic field gradient system selectively causing alternating gradient magnetic fields in the examination region, said magnetic field gradient system being disposed outside of the main magnet,
   a predicting device, configured to predict at least one of a heat load and/or a resulting temperature distribution in the main magnet due to the gradient magnetic fields, and
   a preventing device, configured to prevent, based on the predicted heat load and/or temperature distribution in the main magnet, the main magnet from quenching, and thus ensure stable operation of the main magnet.

2. The magnetic resonance examination system as claimed in claim 1, wherein the predicting device is configured to, prior to image acquisition, predict the heat load and/or the temperature distribution in the main magnet.

3. The magnetic resonance examination system as claimed in claim 1, wherein the predicting device is configured to continuously update and/or to verify the predicted heat load and/or temperature distribution of the main magnet during image acquisition.

4. The magnetic resonance examination system as claimed in claim 3, further including:
   a plurality of temperature sensors which acquire thermal data about the main magnet, the predicting device using the acquired thermal data to verify the predicted heat load and/or temperature distribution during the image acquisition.

5. The magnetic resonance examination system as claimed in claim 4, wherein the predicting device is configured to detect defects of a cooling system of the main magnet.

6. The magnetic resonance examination system as claimed in claim 1, wherein the preventing device is configured to reject an imaging protocol prior to image acquisition and/or to stop execution of an imaging protocol during image acquisition.

7. The magnetic resonance examination system as claimed in claim 1, wherein the preventing device is configured to modify an imaging protocol prior to image acquisition and/or during image acquisition.

8. The magnetic resonance examination system as claimed in claim 1, wherein the main magnet includes a high Tc superconductor operating in a range of 30° K-100° K and the preventing device is configured to allocate cooling power to the main magnet prior to image acquisition and/or during image acquisition sufficient to prevent, based on the predicted heat load and/or temperature distribution of the main magnet, the main magnet from quenching.

9. A method of operating a magnetic resonance examination system which includes a superconducting main magnet surrounding an examination region for generating a main magnetic field in the examination region, and magnetic field gradient system disposed outside the main magnet for selectively causing alternating gradient magnetic fields in the examination region, the method comprises the steps of:
   predicting a heat load and/or a resulting temperature distribution in the main magnet due to the gradient magnetic fields generated according to an imaging protocol, and
   based on the predicted heat load and/or the resulting temperature distribution in the superconducting main magnet, preventing the main magnet from quenching, and thus ensure stable operation of the main magnet.

10. A non-transitory computer readable medium which controls a computer to perform the method as claimed in claim 9.

11. The method as claimed in claim 9, wherein preventing the main magnet from quenching includes at least one of:
    rejecting a selected imaging protocol;
    modifying a selected imaging protocol; and
    allocating additional cooling to the main magnet.

12. The method as claimed in claim 9, wherein predicting the heat load and/or the temperature distribution in the main magnet includes at least one of:
    predicting a heat load and/or a temperature distribution which a selected imaging protocol will cause;
    continuously updating the predicted heat load and/or temperature distribution during image acquisition; and
    sensing a temperature of the main magnet.

13. The method as claimed in claim 9, wherein the predicting step includes predicting a temperature distribution in the main magnet.

14. The magnetic resonance system as claimed in claim 13, wherein the computer is further programmed to predict a temperature distribution in the superconducting main magnet.

15. A magnetic resonance system comprising:

an annular superconducting main magnet which defines an examination region therein;

a magnetic field gradient system which generates magnetic field gradients in the examination region, which magnetic field gradients cause heating of the superconducting main magnet;

at least one processor programmed to perform the method as claimed in claim 9.

16. A magnetic resonance system comprising:

an annular superconducting main magnet which defines an examination region therein;

a magnetic field gradient system which generates magnetic field gradients in the examination region, which magnetic field gradients cause heating of the superconducting main magnet;

at least one processor programmed to:
  based on a selected magnetic resonance protocol, predicting a quenching related behavior of the superconducting main magnet which the selected protocol will cause,
  at least one of: altering cryogenic cooling of the superconducting main magnet, altering the selected protocol, and rejecting the selected protocol based on the predicted quenching related behavior to prevent quenching of the superconducting main magnet.

17. The magnetic resonance system as claimed in claim 16, further including:

a sensor which senses changes in thermal characteristics of the superconducting main magnet; and wherein the one or more processors are further programmed to revise the quenching related behavior based on the sensed changes in thermal characteristics.

* * * * *